United States Patent
Mignot et al.

(10) Patent No.: US 11,501,969 B2
(45) Date of Patent: Nov. 15, 2022

(54) DIRECT EXTREME ULTRAVIOLET LITHOGRAPHY ON HARD MASK WITH REVERSE TONE

(71) Applicant: International Business Machines Corporation, Armonk, NY (US)

(72) Inventors: Yann Mignot, Slingerlands, NY (US); Yongan Xu, Niskayuna, NY (US); Ekmini Anuja De Silva, Slingerlands, NY (US); Ashim Dutta, Menands, NY (US); Chi-Chun Liu, Altamont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 69 days.

(21) Appl. No.: 16/253,429

(22) Filed: Jan. 22, 2019

(65) Prior Publication Data
US 2020/0234957 A1 Jul. 23, 2020

(51) Int. Cl.
*H01L 21/033* (2006.01)

(52) U.S. Cl.
CPC ...... *H01L 21/0337* (2013.01); *H01L 21/0332* (2013.01)

(58) Field of Classification Search
CPC ......... H01L 21/76811; H01L 21/76897; H01L 21/32; H01L 21/0332; H01L 21/0337; H01L 21/0338; H01L 21/3081; H01L 21/3083; H01L 21/3086; H01L 21/3088; H01L 21/0274
See application file for complete search history.

(56) References Cited

U.S. PATENT DOCUMENTS

| | | | | |
|---|---|---|---|---|
| 5,185,235 A | * | 2/1993 | Sato | C09D 9/005 134/40 |
| 5,543,268 A | * | 8/1996 | Tanaka | G03F 7/322 430/309 |
| 7,939,446 B1 | | 5/2011 | Clevenger et al. | |
| 8,084,186 B2 | | 12/2011 | Abdallah et al. | |
| 8,470,711 B2 | | 6/2013 | Arnold et al. | |
| 8,492,282 B2 | | 7/2013 | Devilliers et al. | |
| 9,773,978 B1 | * | 9/2017 | Fraczak | H01L 45/143 |
| 2005/0227172 A1 | * | 10/2005 | Ozaki | G03F 7/0392 430/270.1 |
| 2007/0186953 A1 | * | 8/2007 | Savas | G03F 7/427 134/1.3 |

(Continued)

OTHER PUBLICATIONS

Niyaz Khusnatdinov et al., "Development of a Robust Reverse Tone Pattern Transfer Process," Proceedings of SPIE, vol. 10146, 101461A, 2017, 12 pps.

(Continued)

*Primary Examiner* — Lauren R Bell
(74) *Attorney, Agent, or Firm* — Cantor Colburn LLP; Abdy Raissinia

(57) ABSTRACT

A method of making a semiconductor device includes depositing an oxide material on a patterned mask arranged on a substrate. The method further includes removing a portion of the oxide material such that the patterned mask is exposed. The method also includes removing the patterned mask such that the substrate is exposed between areas of remaining oxide material.

11 Claims, 17 Drawing Sheets

(56) References Cited

U.S. PATENT DOCUMENTS

| | | | |
|---|---|---|---|
| 2008/0292976 A1* | 11/2008 | Terasaki | G03F 7/0017 |
| | | | 430/5 |
| 2010/0040838 A1 | 2/2010 | Abdallah et al. | |
| 2010/0330763 A1* | 12/2010 | Freeman | H01L 21/823425 |
| | | | 438/302 |
| 2012/0291668 A1 | 11/2012 | Dipietro et al. | |
| 2013/0023097 A1* | 1/2013 | Purtell | H01L 29/4236 |
| | | | 257/E21.429 |
| 2015/0187590 A1* | 7/2015 | Ye | H01L 21/3086 |
| | | | 438/500 |
| 2015/0311075 A1* | 10/2015 | Huang | H01L 21/02282 |
| | | | 438/702 |
| 2016/0109804 A1* | 4/2016 | Huli | G03F 7/32 |
| | | | 430/325 |
| 2017/0140921 A1 | 5/2017 | Khusnatdinov et al. | |
| 2020/0274003 A1* | 8/2020 | Li | H01L 29/24 |

OTHER PUBLICATIONS

Yasushi Sakaida et al., "Development of Silicon Glass for Etch Reverse Layer (SiGERL) materials and BARCs for double patterning process," Proceedings of SPIE, vol. 7520, 75201F, 2009, 8 pps.

\* cited by examiner

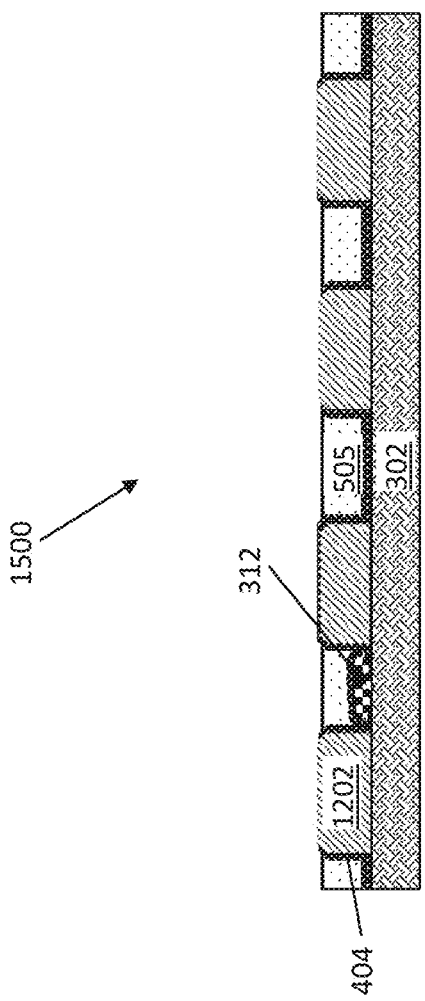

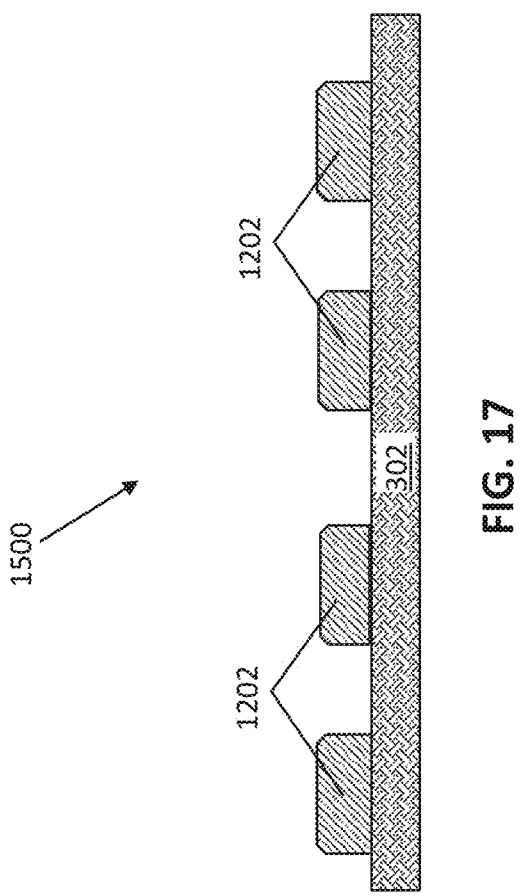

DIRECT EXTREME ULTRAVIOLET LITHOGRAPHY ON HARD MASK WITH REVERSE TONE

BACKGROUND

The present invention generally relates to fabrication methods and resulting structures for semiconductor devices and integrated circuits (ICs). More specifically, the present invention relates to fabrication methods and resulting semiconductor structures that utilize direct extreme ultraviolet lithography (EUV) lithography on a hard mask with reverse tone.

The fabrication of an IC requires a variety of physical and chemical processes performed on a semiconductor (e.g., silicon) substrate. In general, the various processes used to make an IC fall into three categories, namely, film deposition, patterning, and semiconductor doping. Films of both conductors and insulators are used to connect and isolate transistors and their components. Selective doping of various regions of silicon allow the conductivity of the silicon to be changed with the application of voltage. By creating structures of these various components millions of transistors can be built and wired together to form the complex circuitry of a modern microelectronic device.

Fundamental to the above-described processes is lithography. In general, lithography is the formation of three-dimensional relief images on the substrate for subsequent transfer of the pattern to the substrate. To build the complex structures that make up a transistor and the many wires that connect the millions of transistors of a circuit, lithography and etch pattern transfer steps are repeated multiple times to make one circuit. Each pattern being printed on the wafer is aligned to the previously formed patterns, and the conductors, insulators, and selectively doped regions are built up to form the final device.

SUMMARY

Embodiments of the present invention are directed to a method for fabricating a semiconductor device. A non-limiting example of the method includes depositing an oxide material on a patterned mask arranged on a substrate. The method further includes removing a portion of the oxide material such that the patterned mask is exposed. The method also includes removing the patterned mask such that the substrate is exposed between areas of remaining oxide material.

Another non-limiting example of the method includes depositing an oxide material on a patterned mask arranged on a substrate. The method includes removing the patterned mask such that the substrate is exposed between areas of remaining patterned oxide material. The method also includes depositing a refill material on the remaining patterned oxide material. The method includes removing the remaining patterned oxide material such that the substrate is exposed between areas of remaining patterned refill material.

Embodiments of the present invention are directed to a semiconductor device. A non-limiting example of the semiconductor device includes an oxide material arranged on a substrate. The oxide material is arranged as a negatively patterned array of discrete portions of the oxide material. The semiconductor device also includes an oxide coating arranged along one or more sidewalls of each of the discrete portions of the oxide material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 3-7 depict a process flow for forming a semiconductor device according to embodiments of the present invention, in which:

FIG. 3 depicts a cross-sectional side view of a semiconductor device including a patterned mask on a hard mask stack;

FIG. 4 depicts a cross-sectional side view of the semiconductor device subsequent to depositing a coating on the patterned mask and the hard mask stack;

FIG. 5 depicts a cross-sectional side view of the semiconductor device subsequent to depositing a dielectric layer on the coating;

FIG. 6 depicts a cross-sectional side view of the semiconductor device subsequent to removing a portion of the dielectric layer and the coating; and FIG. 7 depicts a cross-sectional side view of the semiconductor device subsequent to removing the patterned mask and leaving the negatively patterned coating and dielectric layer;

FIGS. 8-11 depict a process flow for forming a semiconductor device according to embodiments of the present invention, in which:

FIG. 8 depicts a cross-sectional side view of a semiconductor device including a patterned mask on a metal layer;

FIG. 9 depicts a cross-sectional side view of the semiconductor device subsequent to depositing a coating and a dielectric layer on the patterned mask and the metal layer;

FIG. 10 depicts a cross-sectional side view of the semiconductor device subsequent to removing a portion of the dielectric layer and the coating; and FIG. 11 depicts a cross-sectional side view of the semiconductor device subsequent to removing the patterned mask and leaving the negatively patterned coating and dielectric layer;

FIGS. 12-14 depict a process flow for forming a semiconductor device according to embodiments of the present invention, in which:

FIG. 12 depicts a cross-sectional side view of the semiconductor device subsequent to depositing a refill layer on the negatively patterned coating and dielectric layer of FIG. 7;

FIG. 13 depicts a cross-sectional side view of the semiconductor device subsequent to removing a portion of the refill layer; and FIG. 14 depicts a cross-sectional side view of the semiconductor device subsequent to removing the negatively patterned coating and dielectric layer;

FIGS. 15-17 depict a process flow for forming a semiconductor device according to embodiments of the present invention, in which:

FIG. 15 depicts a cross-sectional side view of the semiconductor device subsequent to depositing a mask layer on the negatively patterned coating and dielectric layer of FIG. 11;

FIG. 16 depicts a cross-sectional side view of the semiconductor device subsequent to removing a portion of the refill layer; and FIG. 17 depicts a cross-sectional side view of the semiconductor device subsequent to removing the negatively patterned coating and dielectric layer.

Figure 1:
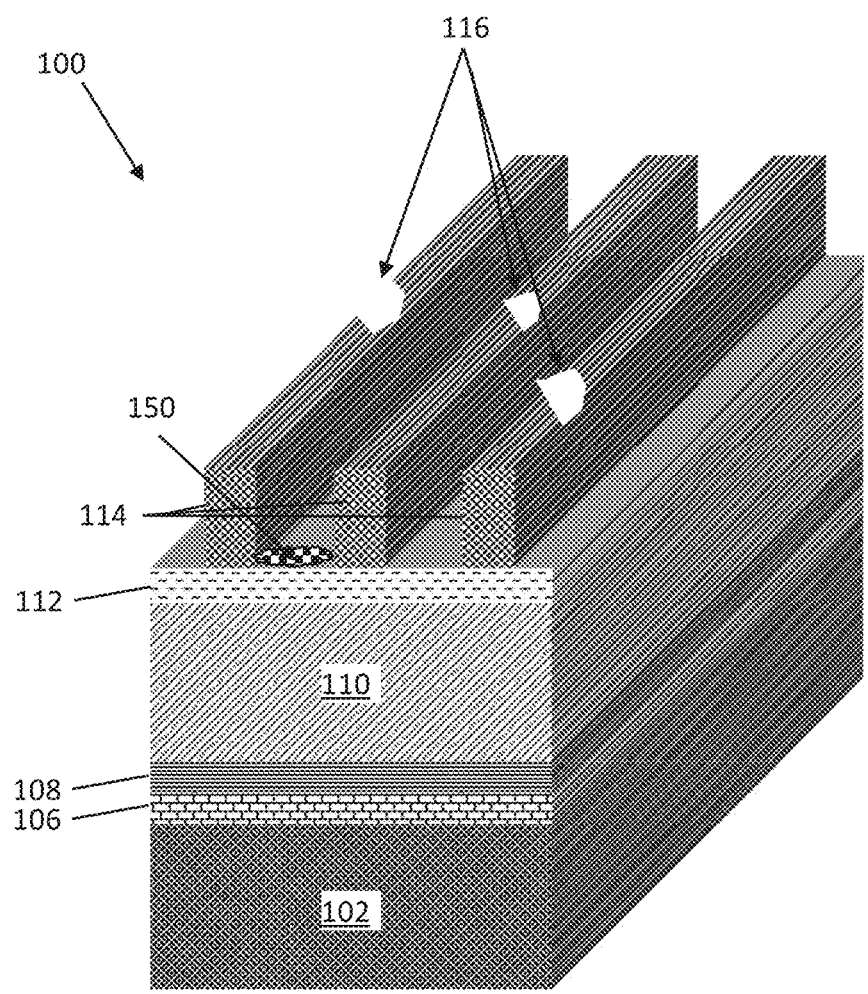
FIG. 1 depicts a perspective view of a semiconductor device with damaged resist lines.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a metal-oxide-semiconductor field-effect transistors (MOSFET) is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

The FinFET is a type of MOSFET. The FinFET is a double-gate or multiple-gate MOSFET device that mitigates the effects of short channels and reduces drain-induced barrier lowering. The term "fin" refers to the narrow channel between source and drain regions. A thin dielectric layer on either side of the fin separates the fin channel from the gate.

The fabrication of ICs includes a series of sequential processing steps, including lithography and etching. Lithography is used to transfer a pattern from a mask or resist to the surface of a semiconductor substrate or wafer. For example, the fins of a FinFET are defined by a specific pattern, which is recorded on a layer of mask or resist applied on the top of the wafer.

The pattern defined by the mask or resist is either removed or remains after processing, depending on whether the resist is "positive" or "negative." A positive resist mask includes a copy of the pattern that is to remain on the substrate, as a stencil for subsequent processing. In contrast, a negative tone resist remains on the surface of the substrate and thus include the inverse or photographic "negative" of the pattern to be transferred. Subsequent to positive or negative tone lithography, etching is a process used to selectively remove material and create patterns.

A challenge of lithography and etching is that resist residue (also referred to as "scum") can be left on the substrate adjacent to a patterned resist. Additionally, patterned resists can become damaged. For example, when narrow resist lines are used to form a plurality (also referred to as a "sea") fins for a FinFET or a metal line for BELL interconnects; the resist lines can become either damaged or even severed or broken.

FIG. 1, for example, depicts a perspective view of a semiconductor device 100 with damaged resist lines 114. Resist residue 150 is also shown between the resist lines 114. The damage 116 to the resist lines 114, as well as resist residue 150 deposited between the resist lines 114, can occur during lithography. The resist lines 114 are formed on a substrate, which includes for example, a first hard mask layer 112 (e.g., a nitride layer), planarization layer 110 (e.g., organic planarization layer (OPL)), second hard mask layer 108 (e.g., a nitride layer), a sacrificial layer 106 (e.g., a sacrificial nitride layer), and a dielectric layer 102.

Figure 2C:
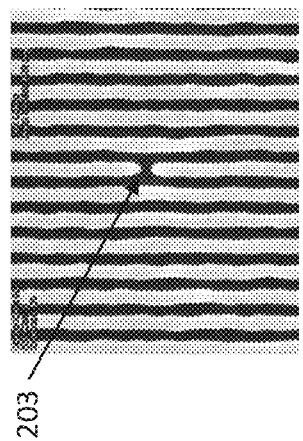
FIG. 2C depicts an electron micrograph showing a top view of a semiconductor device with severed resist lines.
Figure 2B:
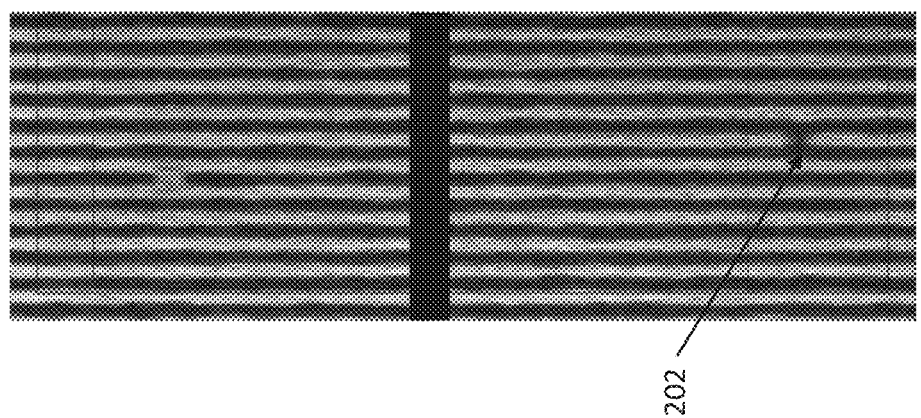
FIG. 2B depicts an electron micrograph showing a top view of a semiconductor device, subsequent to lithography and etching, with damaged resist lines.
Figure 2A:
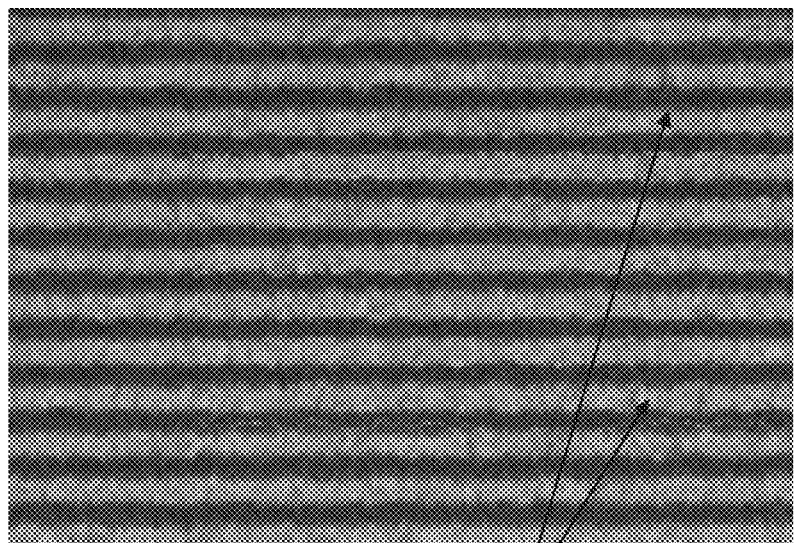
FIG. 2A depicts an electron micrograph showing a top view of a semiconductor device, subsequent to lithography, with damaged resist lines.

FIGS. 2A-2C depict other examples of semiconductor devices with resist line damage. FIG. 2A depicts a top view of a semiconductor device, subsequent to lithography, with damaged resist lines (see damage 202). FIG. 2B depicts a semiconductor device, subsequent to lithography and etching, with damaged resist lines (see damage 202). FIG. 2C depicts a semiconductor device with broken resist lines after metallization and chemical mechanical planarization (CMP) (see severed area 203).

Turning now to an overview of the aspects of the invention, one or more embodiments of the invention address the above-described shortcomings of the prior art by providing fabrication methods and resulting semiconductor structures in which a negative tone (or tone inversion) scheme is used to form a patterned mask. A coating and dielectric layer is deposited on a patterned mask (resist) arranged on a substrate. The coating and dielectric layer cover the patterned mask, as well as the substrate beneath and any resist residue present on the surface of the substrate. Portions of the coating and dielectric layer are removed to expose surfaces of the patterned mask, and then the patterned mask is removed to transfer the pattern to the remaining portions of the coating and dielectric layer, which is referred to as negative tone inversion.

The above-described aspects of the invention address the shortcomings of the prior art by using negative tone inversion followed by a selective etch process to mitigate resist damage and patterned mask line severing. The processes also cover and therefore eliminate and resist residue present on the substrate surface.

Figure 3:
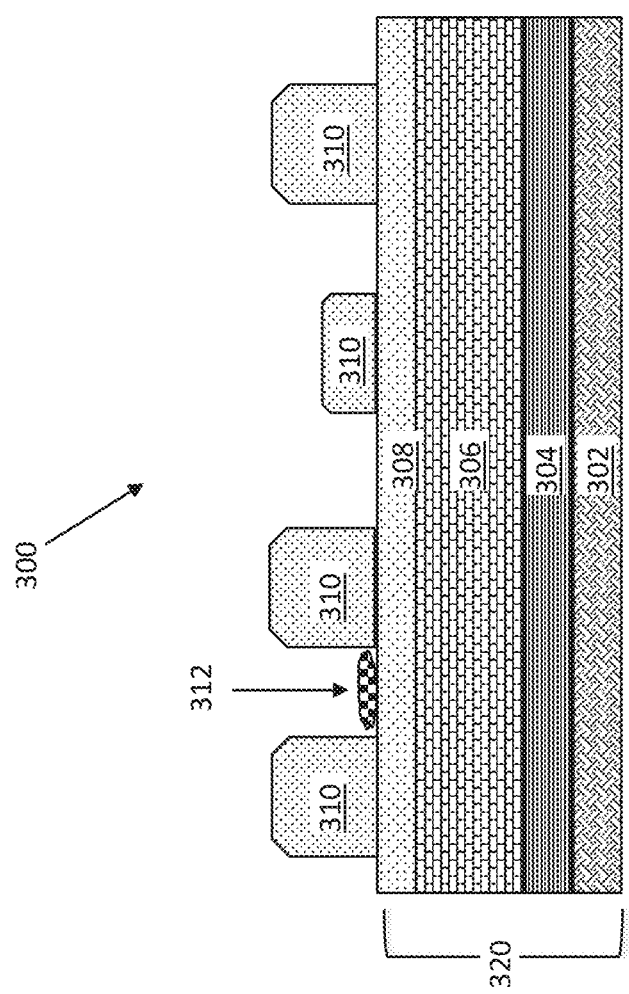

Turning now to a more detailed description of aspects of the present invention, FIGS. 3-7 depict a process flow for forming a semiconductor device 300 according to embodiments of the present invention. FIG. 3 depicts a cross-sectional side view of a semiconductor device 300 including a patterned mask 310 on a substrate, which is a hard mask stack 320. The patterned mask 310 includes a patterned array of discrete portions of the mask material. The patterned mask 310 is a resist that is patterned by EUV lithography. Resist residue 312 can be present on the surface of the hard mask stack 320 between the lines of the patterned lithography mask 310. As shown, the patterned lithography mask can include areas (or lines) with different thicknesses or heights.

The hard mask stack 320 includes multiple layers, for example, hard mask layers, planarization layers, and dielectric layers. The hard mask stack 320 includes a first hard mask layer 308, for example, a silicon nitride layer, onto which the patterned mask 310 is arranged. Other non-limiting examples of materials for the first hard mask layer 308 include low temperature nitride (LTN), amorphous silicon (aSi), or a metal, such as TiN, W, Ru, or a combination thereof.

The hard mask stack 320 also includes a planarization layer 306, for example, an organic planarization layer (OPL) or amorphous carbon layer. The first hard mask layer 308 is arranged on the planarization layer 306. The planarization layer 306 can include an organic material, for example, a polymeric material, or a spin-on material.

The hard mask stack 320 further includes a dielectric layer 304. The dielectric layer 304 can be, for example, tetraethylorthosilicate (TEOS) oxide. The planarization layer 306 is arranged on the dielectric layer 304. Other non-limiting examples of materials for the dielectric layer 304 includes oxides, such as silicon nitride (SiN), aSi, or a combination thereof.

The hard mask stack 320 also includes a metal layer 302. The dielectric layer 304 is arranged on the metal layer 302. The metal layer 302 can be, for example, titanium nitride. Other non-limiting examples of materials for the metal layer 302 include tungsten (W), ruthenium (Ru), aluminum (Al), or a combination thereof.

Figure 4:
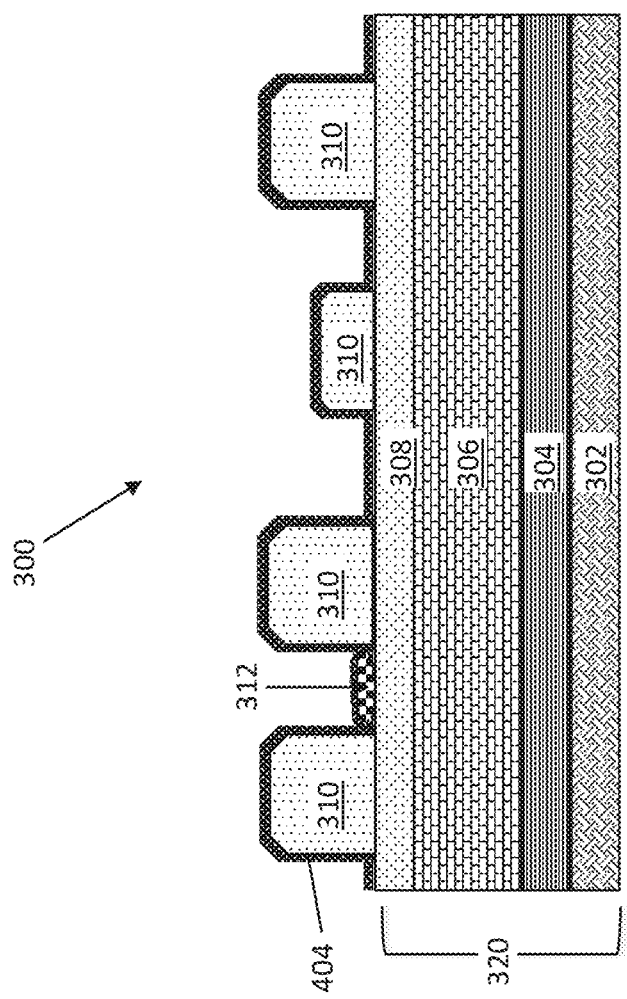

FIG. 4 depicts a cross-sectional side view of the semiconductor device 300 subsequent to depositing a coating 404 on the patterned mask 310 and the hard mask stack 320. The coating 404 covers the patterned mask 310, any resist residue 312 present, and the surface of the hard mask stack 320.

The coating 404 includes an oxide material, for example, a silicon dioxide (e.g., a deposited low temperature oxide), generally referred to as a LTO. Reflow processes can be sued to form the coating 404. The coating 404 has a thickness of about 1 to about 3 nanometers (nm) according to some embodiments of the present invention. According to other embodiments of the present invention, the coating 404 has a thickness of about 1 to about 20 nm. The coating 404 thickness is defined by the resist thickness and the space length between two resist line 310.

Figure 5:
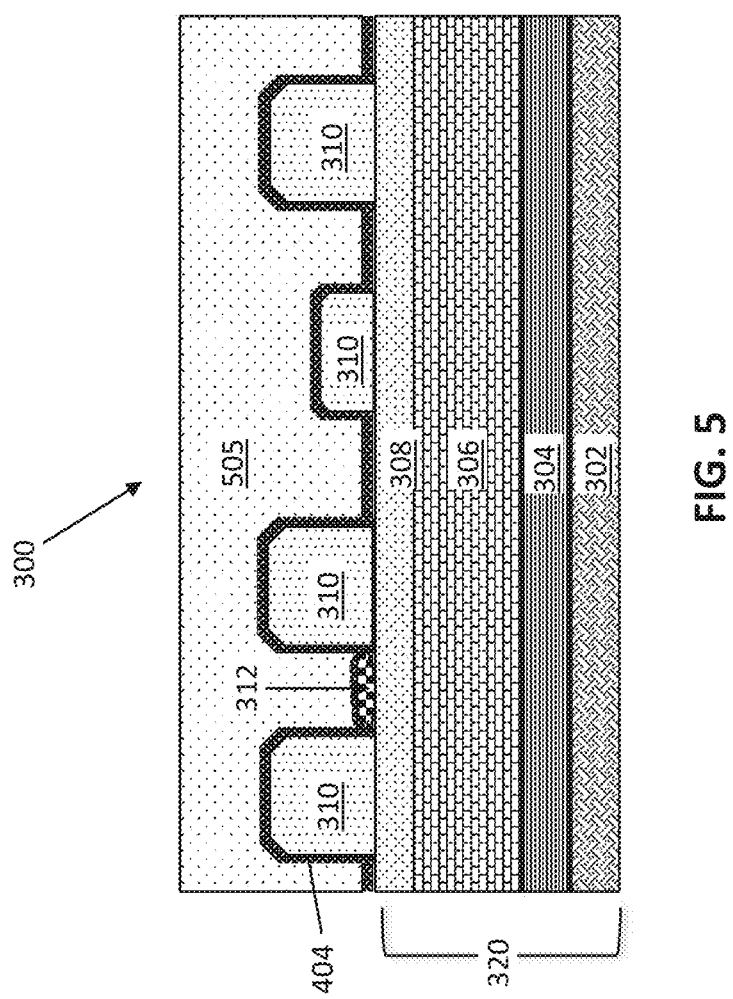

FIG. 5 depicts a cross-sectional side view of the semiconductor device 300 subsequent to depositing a dielectric layer 505 on the coating 404. The dielectric layer 505 includes a spin-on material, for example, spin-on glass (SOG) (i.e., glass deposited by a spin-on deposition process). Other non-limiting examples of materials for the dielectric layer 505 layer include spin-on oxides (oxides deposited by a spin-on deposition process). Spin-coating processes are used to form the dielectric layer 505 because spin coating provides favorable planarization properties, can be done at low temperature, and have very good selectivity. The dielectric layer 505 has a thickness of about 30 to about 300 nanometers (nm) according to some embodiments of the present invention. According to other embodiments of the present invention, the dielectric layer 505 has a thickness of about 30 to about 300 nm.

Figure 6:
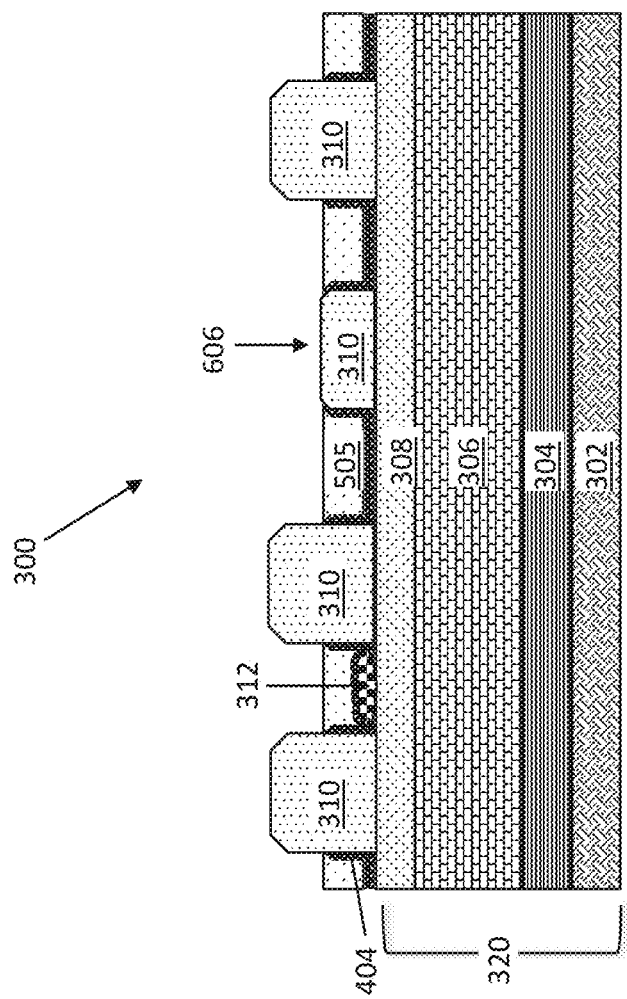

FIG. 6 depicts a cross-sectional side view of the semiconductor device 300 subsequent to removing a portion of the dielectric layer 505 and the coating 404. The dielectric layer 505 and the coating 404 are etched back to expose top surfaces of the discrete portions of the patterned mask 310, including the portion 606 with the smallest thickness. The dielectric layer 505 and coating 404 should still cover any resist residue 312 present on the hard mask stack 320. One or more etch processes are used that are selective for the dielectric layer 505 and the coating 404. In other words, the etch rates of the dielectric layer 505 and the coating 404 are much higher than the etch rate of the patterned mask 310, and therefore, the dielectric layer 505 and coating 404 are removed without etching the patterned lithography mask 310.

The etch processes include one or more wet etch processes. According to some embodiments of the present invention, the etch processes include chemical and physical etching including $CF_4$. Other non-limiting examples of etch processes include CFx family chemistries, such as $C_4F_8$, $CH_2F_2$, $C_6F_6$ for chemical etching, and $N_2$ and Ar for gas dilution and physical etching.

Figure 7:
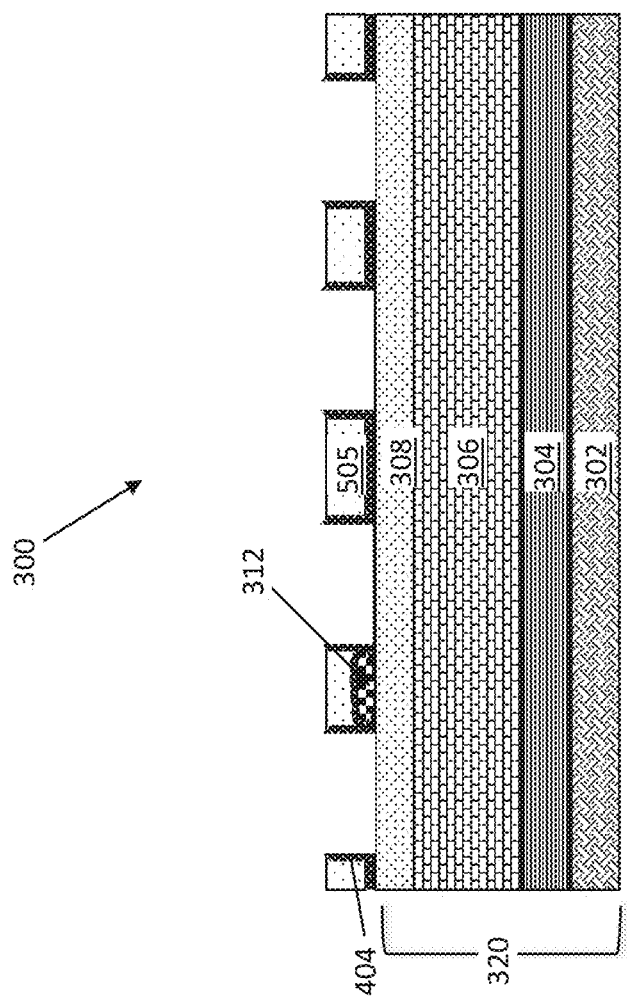

FIG. 7 depicts a cross-sectional side view of the semiconductor device 300 subsequent to removing the patterned resist mask 310 and leaving the negatively patterned coating 404 and dielectric layer 505 covering the resist residues 312 where present, which results in tone inversion (negative tone). The top surface of the substrate (hard mask stack 320) between the remaining areas of the coating 404 and dielectric layer 505 is exposed. The coating 404 and dielectric layer 505 is arranged as a negatively patterned array of discrete portions of the combined material. According to some embodiments of the present invention, the coating 404 and dielectric layer 505 include an oxide material. The coating 404 is arranged along one or more sidewalls of each of the discrete portions of the dielectric layer 505.

The patterned mask 310 is removed by, for example, dry ashing with $O_2$, $CO_2$/CO, $N_2H_2$ etch chemistries that have an high etch rate and good selectivity with dielectric layer 505, coating 404, and first hard mask layer 308.

Figure 8:
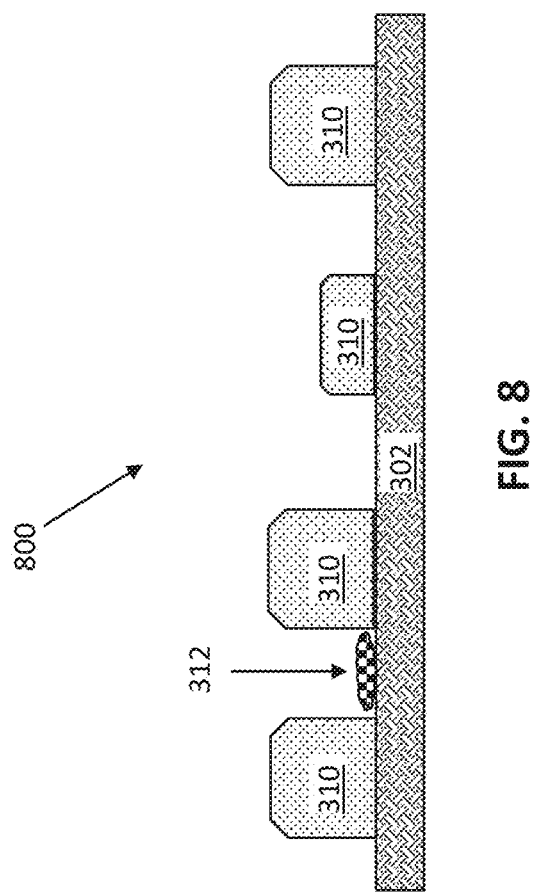

FIGS. 8-11 depict a process flow for forming a semiconductor device 800 according to embodiments of the present invention. FIG. 8 depicts a cross-sectional side view of a semiconductor device 800 including a patterned mask 310 on a substrate, which is a metal layer 302. The patterned lithography mask 310 is arranged directly on the metal layer 302 as shown in some embodiments of the present invention. The patterned mask 310 is a resist that is patterned by EUV lithography. Resist residue 312 can be present on the surface of the hard mask stack 302 between the lines of the patterned mask 310. As shown, the patterned lithography mask 310 may, or may not (not shown) include areas (or lines) with different thicknesses or heights.

Figure 9:
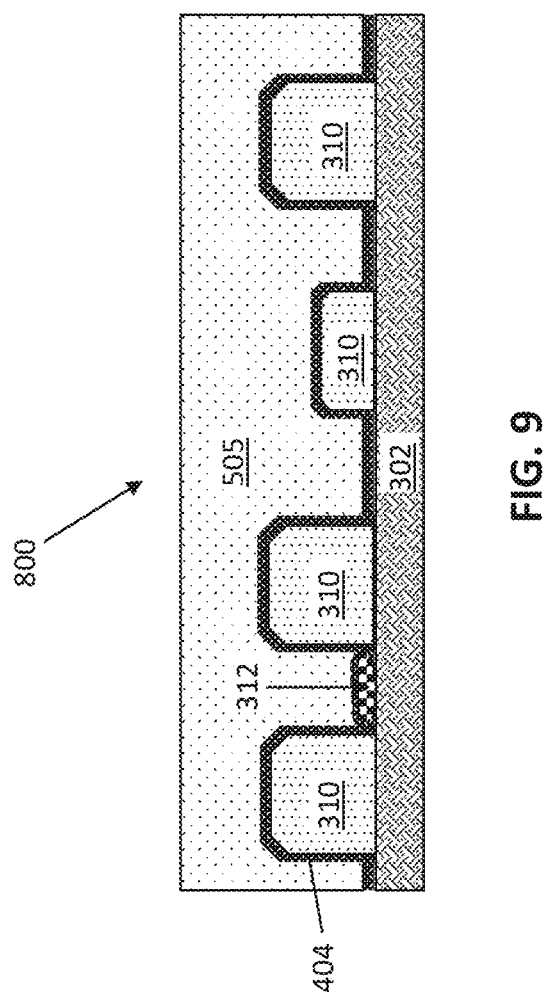

FIG. 9 depicts a cross-sectional side view of the semiconductor device 800 subsequent to depositing a coating 404 and a dielectric layer 505 on the patterned mask 310 and the metal layer 302. The coating 404 covers the patterned mask 310, any resist residue 312, and the surface of the metal layer 302. The dielectric layer 505 includes a spin-on material, for example, spin-on glass (SOG).

Figure 10:
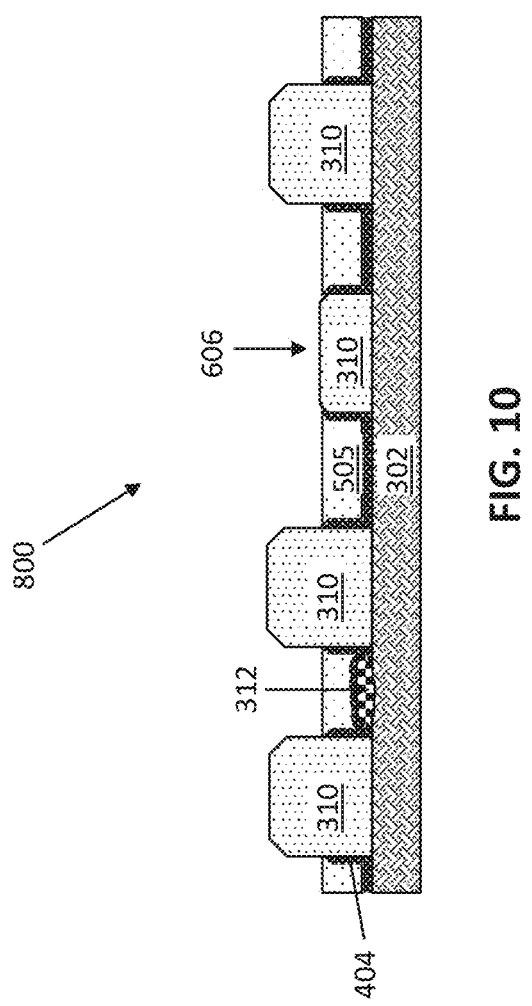

FIG. 10 depicts a cross-sectional side view of the semiconductor device 800 subsequent to removing a portion of the dielectric layer 505 and the coating 404. The dielectric layer 505 and the coating 404 are etched back to expose top surfaces of the patterned mask 310, including the portion 606 with the smallest thickness. The dielectric layer 505 and coating 404 should still cover any resist residue 312 present on the metal layer 302. One or more etch processes are used that are selective for the dielectric layer 505 and the coating 404. In other words, the etch rates of the dielectric layer 505 and the coating 404 are much higher than the etch rate of the patterned mask 310, and therefore, the dielectric layer 505 and coating 404 are removed without etching the patterned mask 310. The etch processes include one or more wet etch processes, as described above.

Figure 11:
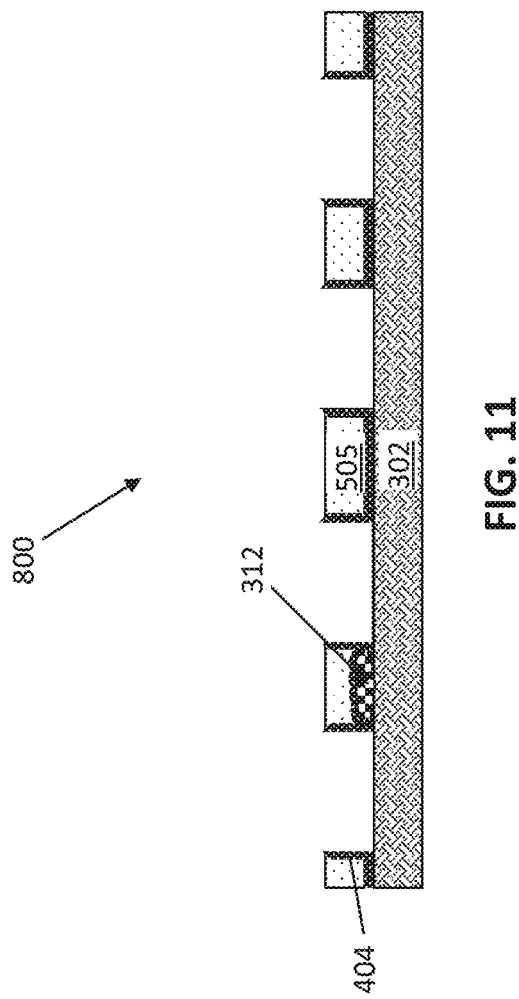

FIG. 11 depicts a cross-sectional side view of the semiconductor device 800 subsequent to removing the patterned mask 310 by dry ashing and leaving the negatively patterned coating 404 and dielectric layer 505, which results in tone inversion (negative tone).

Figure 12:
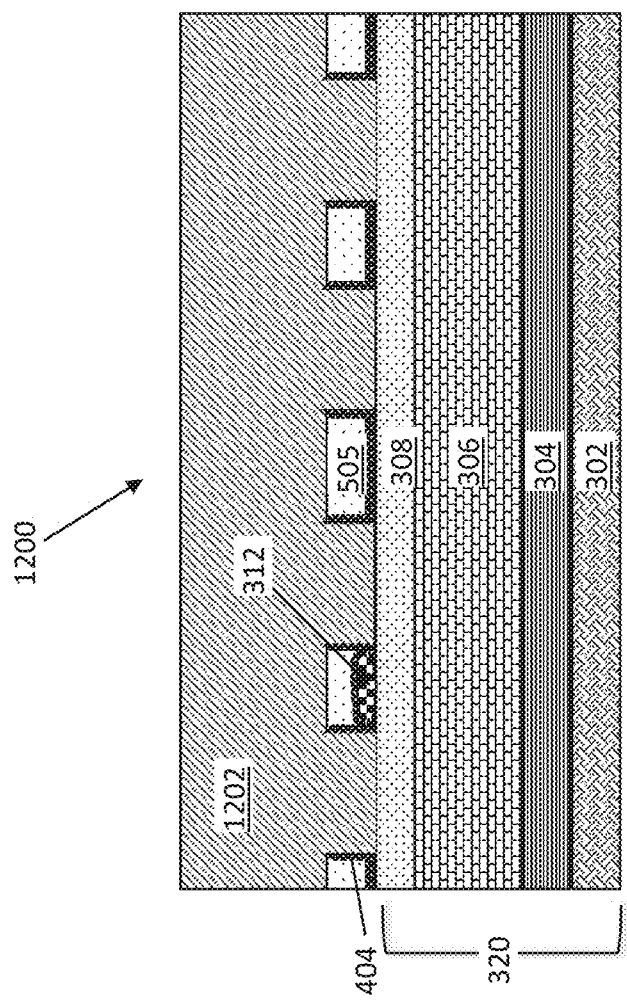
Figure 13:
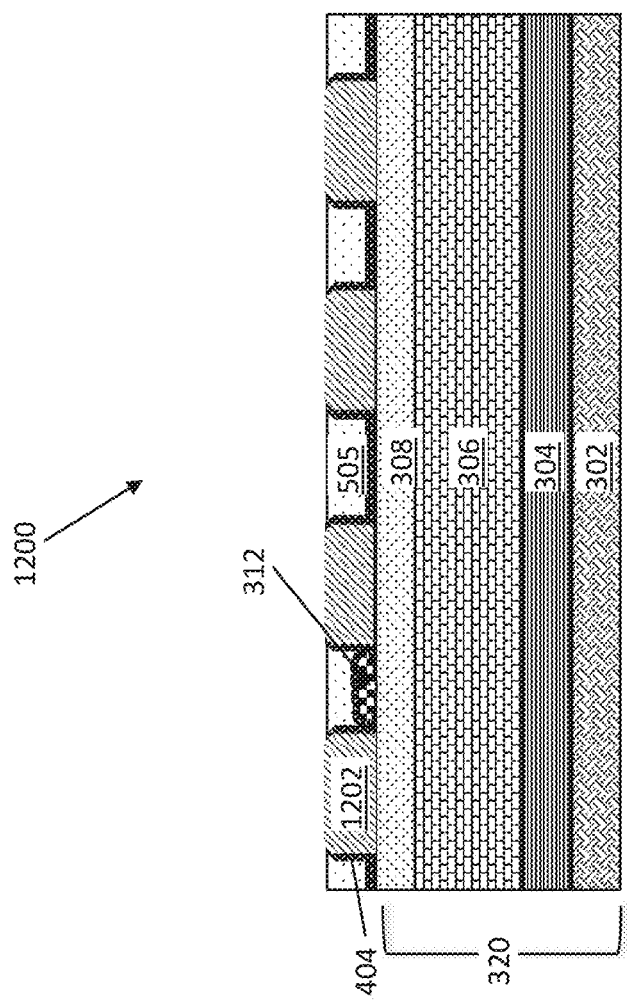
Figure 14:
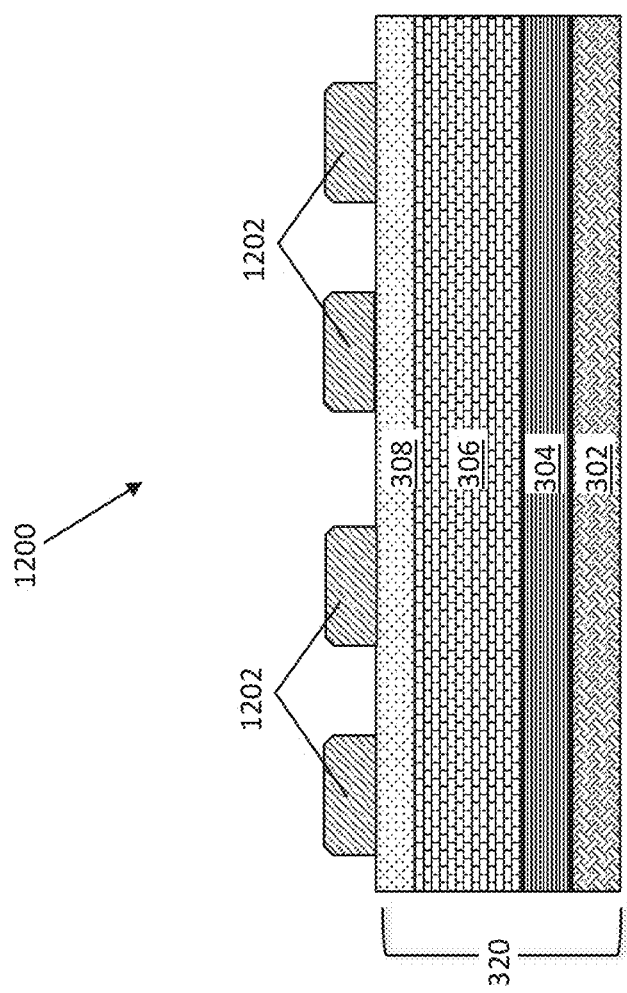

FIGS. 12-14 depict a process flow for forming a semiconductor device 1200 according to embodiments of the present invention. FIG. 12 depicts a cross-sectional side view of the semiconductor device 1200 subsequent to depositing a refill material 1202 on the patterned coating 404 and dielectric layer 505 of FIG. 7. After negative tone inversion, the refill material 1202 covers and fills the spaces between areas (lines) of the patterned coating 404 and dielectric layer 505.

According to one or more embodiments of the present invention, the refill 1202 material is a silicon material. Non-limiting examples of silicon materials for the refill material 1202 include silicon nitride, amorphous silicon, or a combination thereof.

FIG. 13 depicts a cross-sectional side view of the semiconductor device 1200 subsequent to removing a portion of the refill material 1202. The refill material 1202 is either etched back or planarized, for example by CMP, to expose the top surfaces of the negatively patterned coating 404 and dielectric layer 505.

FIG. 14 depicts a cross-sectional side view of the semiconductor device 1200 subsequent to removing the remaining negatively patterned coating 404 and dielectric layer 505, resulting is a second negative tone inversion. The substrate is exposed between areas of remaining patterned refill material 1202. One or more etch processes are used that are selective for the coating 404, dielectric layer 505, and the resist residue 312. In other words, the etch rates of the coating 404, dielectric layer 505, and resist residue 312 are much higher than the etch rate of the refill material 1202, and therefore, the coating 404, dielectric layer 505, and resist residue 312 are removed without etching the refill material 1202.

The etch processes include one or more wet etch processes. Separate etch processes can be used for each of the coating 404, dielectric layer 505, and resist residue 312. According to some embodiments of the present invention, etching with $CF_4$ is used to remove the dielectric layer 505 and coating 404. According to one or more embodiments of the present invention, etching with an $O_2$ base is used to remove the resist reside 312.

Figure 15:
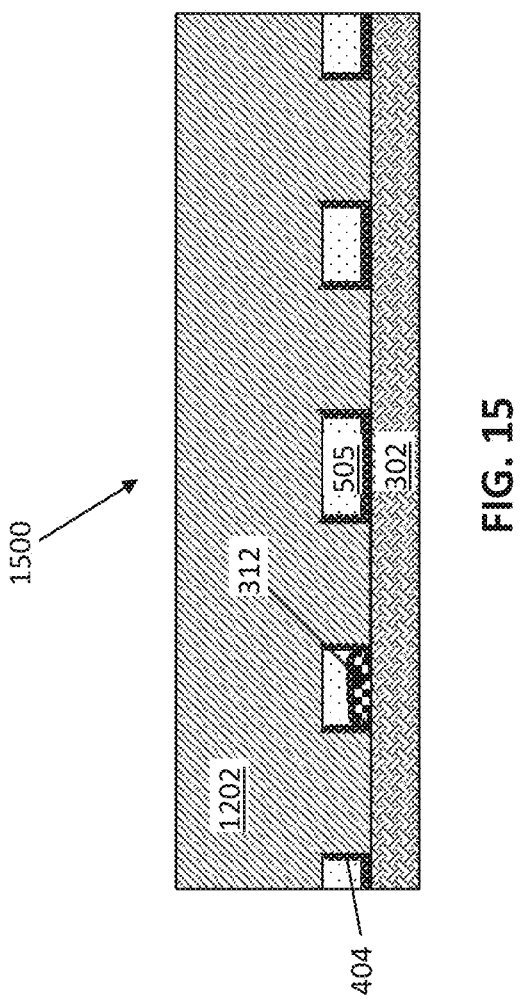

FIGS. 15-17 depict a process flow for forming a semiconductor device 1500 according to embodiments of the present invention. FIG. 15 depicts a cross-sectional side view of the semiconductor device 1500 subsequent to depositing a refill layer 1202 on the negatively patterned coating 404 and dielectric layer 505 of FIG. 11. After negative tone inversion, the refill material 1202 covers and fills the spaces between areas (lines) of the negatively patterned coating 404 and dielectric layer 505. According to one or more embodiments of the present invention, the refill material 1202 is a silicon material, as described above.

FIG. 16 depicts a cross-sectional side view of the semiconductor device 1500 subsequent to removing a portion of the refill material 1202. The refill material 1202 is either etched back or planarized, for example by CMP, to expose the top surfaces of the patterned coating 404 and dielectric layer 505.

FIG. 17 depicts a cross-sectional side view of the semiconductor device 1500 subsequent to removing the patterned coating 404 and dielectric layer 505, resulting in a second negative tone inversion. One or more etch processes are used that are selective for the coating 404, dielectric layer 505, and the resist residue 312. In other words, the etch rates of the coating 404, dielectric layer 505, and resist residue 312 are much higher than the etch rate of the refill material 1202, and therefore, the coating 404, dielectric layer 505, and resist residue 312 are removed without etching the refill material 1202.

The etch processes include one or more wet etch processes. Separate etch processes can be used for each of the coating 404, dielectric layer 505, and resist residue 312. According to some embodiments of the present invention, etching with $CF_4$ is used to remove the dielectric layer 505 and coating 404. According to one or more embodiments of the present invention, etching with an $O_2$ base is used to remove the resist reside 312.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment can include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:
1. A method of making a semiconductor device, the method comprising:
depositing, by a reflow process, an oxide material on a patterned mask arranged on a substrate, the patterned mask having lines and openings therebetween, and the openings in the patterned mask being deep enough to expose the substrate beneath, a residue of the patterned mask arranged on the substrate in the openings between the lines, the oxide material being silicon dioxide, covering the residue, the oxide material deposited directly on a portion of the substrate, and the oxide material having a thickness of about 1 to about 20 nm;

depositing, by a spin-on deposition process, a dielectric layer on the oxide material, the dielectric layer being glass, a separate layer from the oxide material, and having a thickness of about 30 to about 300 nm;

removing a portion of each of the oxide material and the dielectric layer such that each of the lines are exposed, at least two of the lines having different heights, the oxide material lining vertical side walls of the patterned mask, and the dielectric layer between the oxide material lining the vertical sidewalls; and removing the patterned mask such that the substrate is exposed between areas of remaining oxide material.

2. The method of claim 1, wherein the substrate comprises a hard mask stack.

3. The method of claim 1, wherein the substrate comprises a metal layer.

4. The method of claim 1, wherein the residue is a scum left remaining on the substrate.

5. The method of claim 1, wherein:

the substrate comprises a hard mask stack that includes another dielectric layer, an organic planarization layer directly on the dielectric layer, and a hard mask layer directly on the organic planarization layer; and and the patterned mask is directly on the hard mask layer.

6. The method of claim 5, wherein the another dielectric layer of the substrate is tetraethylorthosilicate oxide, and the hard mask layer is silicon nitride.

7. A method of making a semiconductor device, the method comprising:

depositing, by a reflow process, an oxide material on a patterned mask arranged on a substrate, the patterned mask having lines and openings therebetween, and the openings in the patterned mask being deep enough to expose the substrate beneath, a residue of the patterned mask arranged on the substrate, the oxide material being silicon dioxide, covering the residue, the oxide material deposited directly on a portion of the substrate, and the oxide material having a thickness of about 1 to about 20 nm;

depositing, by a spin-on deposition process, a dielectric layer on the oxide material, the dielectric layer being glass, having a thickness of about 30 to about 300 nm, and being a separate discrete layer from the oxide material;

removing portions of each of the oxide material and the dielectric layer to expose each of the lines, at least two of the lines having different heights, the oxide material lining vertical side walls of the patterned mask, and the dielectric layer between the oxide material lining the vertical side walls;

removing the patterned mask such that the substrate is exposed between areas of remaining oxide material and remaining dielectric layer;

depositing a refill material on the dielectric layer;

removing a portion of the refill material to expose the dielectric layer; and removing remaining portions of each of the oxide material and the dielectric layer such that the substrate is exposed between areas of remaining refill material.

8. The method of claim 7, wherein the substrate comprises a hard mask stack or a metal layer.

9. The method of claim 7, wherein the refill material comprises a silicon material.

10. The method of claim 9, wherein the silicon material comprises silicon nitride, amorphous silicon, or a combination thereof.

11. The method of claim 7, wherein depositing the oxide material is by a low temperature process.

* * * * *